(12) United States Patent
Kess

(10) Patent No.: US 7,696,754 B2
(45) Date of Patent: Apr. 13, 2010

(54) MAGNETIC RESONANCE LOCAL COIL ARRANGEMENT AND METHOD FOR COMMUNICATING AN OVERLOAD OCCURRENCE

(75) Inventor: Helmut Kess, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 117 days.

(21) Appl. No.: 12/137,723

(22) Filed: Jun. 12, 2008

(65) Prior Publication Data

US 2008/0309342 A1  Dec. 18, 2008

(30) Foreign Application Priority Data

Jun. 12, 2007  (DE) ............. 10 2007 026 915

(51) Int. Cl.
*G01V 3/00* (2006.01)

(52) U.S. Cl. ..................... 324/318; 324/309

(58) Field of Classification Search ......... 324/300–335; 600/407–445
See application file for complete search history.

(56) References Cited

U.S. PATENT DOCUMENTS

| | | | |
|---|---|---|---|
| 6,545,475 B2 | 4/2003 | Krockel et al. | |
| 7,221,159 B2 * | 5/2007 | Griffiths et al. | ............. 324/318 |
| 7,230,425 B2 * | 6/2007 | Leussler | ..................... 324/318 |

* cited by examiner

*Primary Examiner*—Brij B Shrivastav
(74) *Attorney, Agent, or Firm*—Schiff Hardin LLP

(57) ABSTRACT

A local coil arrangement for magnetic resonance applications has an acquisition coil for acquisition of a magnetic resonance signal excited in an examination subject by means of a transmission coil; and a transponder. The transponder is coupled to the acquisition coil such that it can be fed with electrical energy via the acquisition coil The transponder is fashioned to send a transponder signal on a transponder frequency when and as soon as an excitation signal induced in the acquisition coil by means of the transmission coil exceeds a threshold. When the control device receives the transponder signal, it adjusts the further operation of the transmission antenna or operates it only with reduced power.

7 Claims, 2 Drawing Sheets

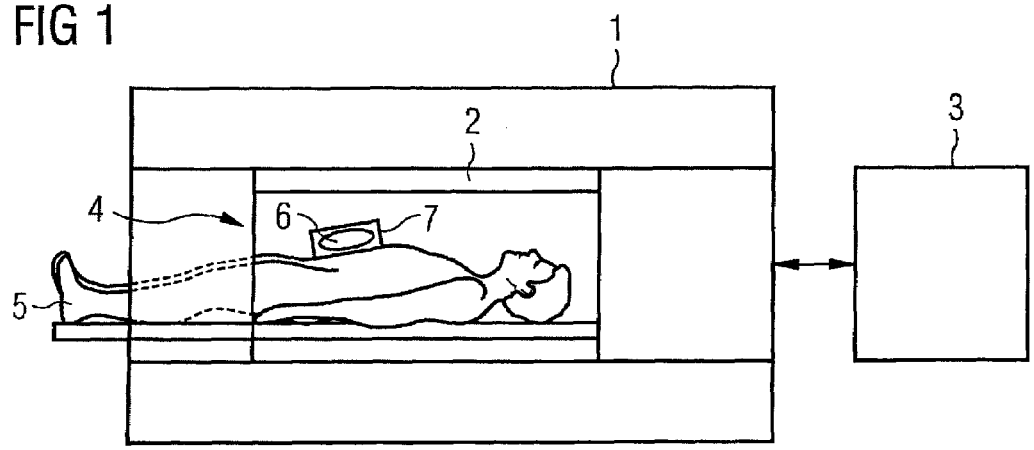
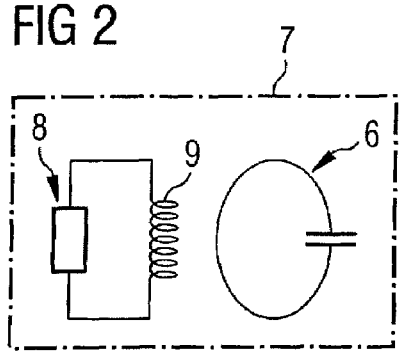
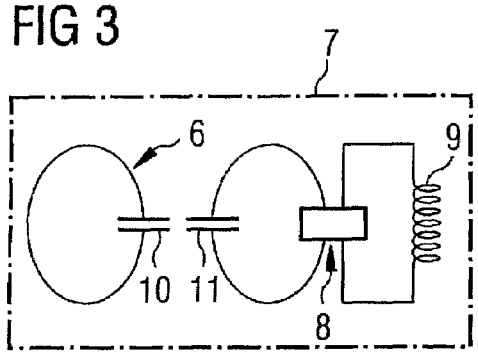
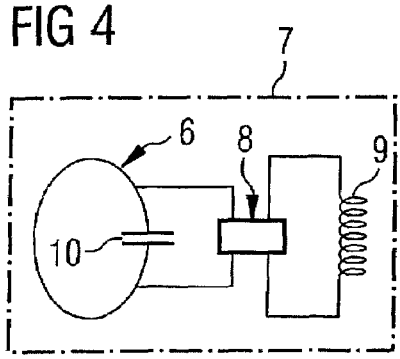
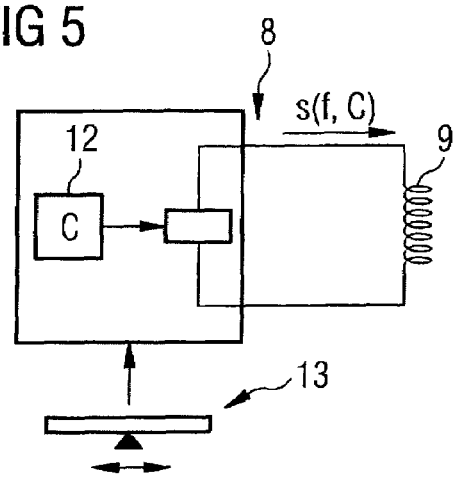

MAGNETIC RESONANCE LOCAL COIL ARRANGEMENT AND METHOD FOR COMMUNICATING AN OVERLOAD OCCURRENCE

BACKGROUND OF THE INVENTION

1. Field of the Invention

The present invention concerns a local coil arrangement for magnetic resonance applications of the type having an acquisition coil for acquisition of a magnetic resonance signal excited in an examination subject by means of a transmission coil; and a transponder.

The present invention furthermore concerns an operating method for a magnetic resonance system of the type wherein a temporally static, spatially homogeneous basic magnetic field is generated in an examination region of the magnetic resonance system by means of a basic magnet of the magnetic resonance system, the examination region is charged with a spatially homogeneous radio-frequency transmission signal by means of a transmission antenna of the magnetic resonance system, and a control device of the magnetic resonance system checks whether it receives a transponder signal from a transponder of a local coil arrangement of the type described above.

2. Description of the Prior Art

Local coil arrangements and operating methods of the above general type are known. For example, the transponders are used in order to detect the presence of the local coil arrangement in the examination region of a magnetic resonance system. DE 101 30 617 A1 describes an example of such a system.

Magnetic resonance signals excited in an examination subject (normally a person) are very weak. They can be detected by means of a whole-body coil (which is normally the same as the transmission coil) only with a relatively low SNR. The local coil arrangement therefore is used in order to acquire an excited magnetic resonance signal with better SNR from a spatially limited region.

The examination subject is charged with a relatively strong transmission signal by means of the transmission coil to excite the magnetic resonance signal. A current and/or a voltage are also induced in the acquisition coil of the local coil arrangement. In some cases it can occur that the current and/or the voltage are so high that a risk to the examination subject exists.

In the prior art it is known to provide a fuse to avoid such an endangerment of the examination subject in the AC coil. If too strong a field is induced by the transmission coil, the fuse melts. Although the examination subject is protected by this procedure, the acquisition coil is destroyed. A further disadvantage of the use of fuses is that these negatively influence the SNR.

Furthermore, it is known to use elaborate electronic circuits and conductors that, however, introduce a certain uncertainty factor. It is in particular possible that sheath waves are induced in the conductors.

SUMMARY OF THE INVENTION

An object of the present invention is to provide a simple embodiment of a local coil arrangement by means of which the acquisition coil can be monitored for impermissibly high currents and/or voltages. A further object of the invention is to provide an operating method for a magnetic resonance system by means of which a safer operation of the magnetic resonance system can be ensured in a simple manner.

According to the invention, the transponder is coupled to the acquisition coil such that it can be fed with electrical energy via the acquisition coil. It is fashioned so as to send a transponder signal on a transponder frequency when and as soon as an excitation signal induced in the acquisition coil by means of the transmission coil exceeds a threshold. In the event of receipt of the transponder signal, the control device adjusts the further operation of the transmission antenna or operates the transmission antenna only with reduced power.

In the present invention the transponder (often also designated as an RFID tag) is thus used entirely differently than in the prior art.

The transponder may have an adjustment element with which the threshold can be adjusted. Alternatively, the threshold can be determined in that the acquisition coil supplying the transponder with electrical energy such that the transponder signal can be emitted by the transponder.

The transponder can be coupled to the acquisition coil inductively or capacitively (but not galvanically). In this case the threshold can be adjusted by adjusting the distance of the transponder from the acquisition coil, for example, in addition or as an alternative to an adjustment by means of an adjustment element.

Alternatively, it is possible for the acquisition coil to have a coupling capacitor and for the transponder to galvanically tap a capacitor voltage across the coupling capacitor. In this case an adjustment of the threshold is possible exclusively when a corresponding adjustment element is present.

The transponder can emit the transponder signal without modulation. This is sufficient because the acquisition of such a signal can already trigger, for example, the interruption of a measurement sequence (meaning, among other things, the activation of the transmission coil) or a reduction of the transmission power with which the transmission coil is operated. By contrast, it is better if the transponder signal contains an identification code using which the transponder (and therefore indirectly the acquisition coil) can be identified. In this embodiment it can in some cases be possible to take less drastic measures.

BRIEF DESCRIPTION OF THE DRAWINGS

FIG. 1 schematically illustrates a magnetic resonance system.

FIGS. 2 through 4 respectively show embodiments of a local coil arrangement in accordance with the invention.

FIG. 5 shows an embodiment for a transponder electronic in accordance with the invention.

DESCRIPTION OF THE PREFERRED EMBODIMENTS

Figure 6:
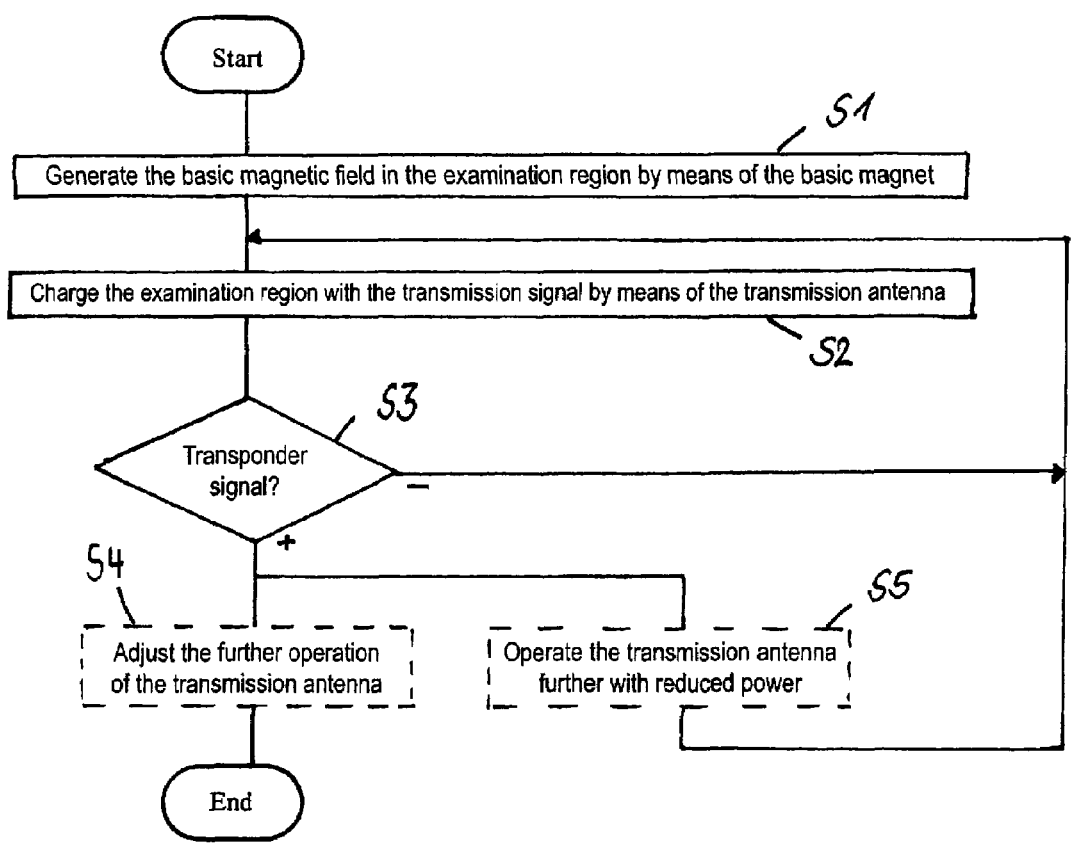
FIG. 6 is a flowchart of an embodiment of the inventive method.

According to FIG. 1, among other things a magnetic resonance system possesses a basic magnet 1, a transmission coil 2 and a control device 3. Usually a gradient coil system is also present. A temporally static, spatially homogeneous basic magnetic field is generated in an examination region 4 of the magnetic resonance system by the basic magnet 1. The transmission coil 2 can be operated based on a corresponding activation by the control device 3, for example such that it charges the examination region 4 with a spatially homogeneous radio-frequency transmission signal. It is thus possible to excite nuclei in an examination subject 5 (for example a patient) located in the examination region 4 to emit magnetic resonance signals. The excited magnetic resonance signals are received by an acquisition coil 6 of a local coil arrangement 7, for example, and are fed via conductors or wirelessly to the control device 3 (or a separate evaluation device).

In order to be able to receive the magnetic resonance signal, the local coil arrangement 7 must be arranged in the examination region 4. Due to the arrangement of the local coil arrangement 7 in the examination region 4, the acquisition coil 6 is also exposed to the transmission signal of the transmission coil 2. It can therefore occur that an excitation signal is induced in the acquisition coil 7 by means of the transmission coil 2. The voltages and/or currents can be so large that the risk of injury to the examination subject 5 exists, for example the risk of an impermissibly high local heating.

In order to promptly counteract this danger, the local coil arrangement 7 (see FIG. 2 through 4) possesses a transponder 8 in addition to the acquisition coil 6. The transponder 8 is coupled to the acquisition coil 6 such that it can be fed with electrical energy via the acquisition coil 6. According to FIG. 2, for example, the transponder 8 has a transponder antenna 9 that is inductively coupled to the acquisition coil 6. According to FIG. 3, the acquisition coil 6 has first coupling capacitors 10, the transponder 8 second coupling capacitors 11. The transponder 8 is capacitively coupled to the acquisition coil 6 via the coupling capacitors 10, 11. For example, according to FIG. 4 the acquisition coil 6 possesses a coupling capacitor 10. The transponder 8 galvanically taps a capacitor voltage across the coupling capacitor 10. In the embodiment according to FIG. 4, a galvanic coupling of the transponder 8 to the acquisition coil 6 thus exists. By contrast, no galvanic coupling is present in the embodiments according to FIGS. 2 and 3.

Independently of the type of coupling of the transponder 8 to the acquisition coil 6, the transponder 8 is fashioned such that it sends a transponder signal S on a transponder frequency f if and as soon as the excitation signal induced in the acquisition coil 6 exceeds a threshold (see in particular FIG. 5). It is thus possible for the transponder 8 to have a memory 12 in which an identification code C is stored. In the event of this embodiment the transponder 8 reads the identification code C from the memory 12 and modulates the transponder signal S corresponding to the identification code C. The transponder 8 (and therefore indirectly the acquisition coil 6) is thus identifiable using the identification code C. The identification code C is hereby advantageously unique; it is thus always assigned only once even in structurally identical local coil arrangements 7.

The control device 3 receives the transponder signal S and reacts correspondingly independently of whether the transponder signal S contains the identification code C or not. For example, it can adjust the further operation of the transmission coil 2 or operate the transmission coil 2 only with reduced power.

According to FIG. 5, the transponder 8 has an adjustment element 13. For example, the threshold that is checked for compliance in the excitation signal induced in the acquisition coil 6 can be set by means of the adjustment element 13. However, the presence of the adjustment element 13 is not absolutely necessary. If the adjustment element 13 is not present, the threshold can be determined by the acquisition coil 6 supplying the transponder 8 with electrical energy such that the transponder signal S can be emitted by the transponder 8. In this case in particular the transponder 8 can be designed very simply. When, in this case, sufficient energy is injected into the transponder 8, the transponder signal S is emitted immediately without further, explicit comparison.

In the case that no galvanic coupling of the transponder 8 to the acquisition coil 6 exists (see FIGS. 2 and 3), it is furthermore possible to adjust the threshold in a different manner. A degree of coupling with which the acquisition coil 6 and the transponder 8 are coupled with one another dependent on the distance of the transponder antenna 9 from the acquisition coil 6 (see FIG. 2), or on the distance of the coupling capacitors 10, 11 from one another (see FIG. 3).

The operating method according to the invention is subsequently explained briefly in connection with FIG. 6.

According to FIG. 6, in a step S1 the basic magnetic field is generated in the examination region 4 by means of the basic magnet 1. In a step S2 the examination region 4 is charged with the transmission signal by means of the transmission antenna 2. In a step S3 the control device 3 checks whether it receives the transponder signal S. If the control device 3 does not receive the transponder signal S, it returns to step S2.

If the control device 3 receives the transponder signal S, the control device 3 alternatively passes to a step S4 or to a step S5. Since the two steps S4 and S5 are alternative, they are drawn with dashes in FIG. 6.

In step S4 the control device 3 adjusts the further operation of the transmission antenna 2. The control device 3 operates the transmission antenna 2 further in step S5, but only with reduced power. From step S5 the workflow returns to step S2.

The procedure according to the invention possesses many advantages. It particularly leads to a high operating safety. Furthermore, no additional cables are required. Finally, the acquisition coil 6 can be operated with a good SNR.

Although modifications and changes may be suggested by those skilled in the art, it is the intention of the inventor to embody within the patent warranted hereon all changes and modifications as reasonably and properly come within the scope of his contribution to the art.

I claim as my invention:

1. A local coil arrangement for magnetic resonance applications comprising:
    an acquisition coil for acquisition of a magnetic resonance signal excited in an examination subject by means of a transmission coil;
    a transponder that is coupled to the acquisition coil so as to be fed with electrical energy via the acquisition coil; and
    the transponder being configured to send a transponder signal on a transponder frequency when and as soon as an excitation signal induced in the acquisition coil by the transmission coil exceeds a threshold.

2. A local coil arrangement according to claim 1, wherein the transponder has an adjustment element that adjusts the threshold.

3. A local coil arrangement according to claim 1, wherein the acquisition coil supplies the transponder with electrical energy to cause the transponder signal to be emitted by the transponder.

4. A local coil arrangement according to claim 1, wherein the transponder is inductively or capacitively, but not galvanically), coupled to the acquisition coil.

5. A local coil arrangement according to claim 1 wherein the acquisition coil comprises a coupling capacitor, and wherein the transponder galvanically taps a capacitor voltage across the coupling capacitor.

6. A local coil arrangement according to claim 1 wherein the transponder is configured to emit the transponder signal with an identification code continued therein that identifies the transponder and thus also indirectly identifies the acquisition coil.

7. An operating method for a magnetic resonance system, comprising the steps of:
    generating a temporally static, spatially homogeneous basic magnetic field is in an examination region of the magnetic resonance system with a basic magnet of the magnetic resonance system;

charging the examination region with a spatially homogeneous radio-frequency transmission signal emitted by a transmission antenna of the magnetic resonance system;

with a control device of the magnetic resonance system, checking whether the control device receives a transponder signal from a transponder of a local coil arrangement of the magnetic resonance system; and with the control device, automatically adjusting further operation of the transmission antenna or operating the transmission antenna only with reduced power upon receipt of the transponder signal by the control signal.

* * * * *